(12) United States Patent
Liao et al.

(10) Patent No.: US 8,665,224 B2
(45) Date of Patent: Mar. 4, 2014

(54) CAPACITANCE TOUCH SENSOR

(75) Inventors: Tung-Tsai Liao, Hsin Chu (TW); Li Sheng Lo, Hsin Chu County (TW); Chih Hsiang Yang, Chang Hua County (TW)

(73) Assignee: Generalplus Technology Inc., Hsin-Chu (TW)

(*) Notice: Subject to any disclaimer, the term of this patent is extended or adjusted under 35 U.S.C. 154(b) by 1093 days.

(21) Appl. No.: 12/102,553

(22) Filed: Apr. 14, 2008

(65) Prior Publication Data
US 2008/0251299 A1  Oct. 16, 2008

(30) Foreign Application Priority Data
Apr. 13, 2007 (TW) ................. 96112960 A

(51) Int. Cl.
*G06F 3/041* (2006.01)
*H03K 17/94* (2006.01)

(52) U.S. Cl.
USPC ............................................. 345/173; 341/33

(58) Field of Classification Search
USPC ............... 345/173–178; 341/20, 33, 658, 663
See application file for complete search history.

(56) References Cited

U.S. PATENT DOCUMENTS

| | | | | |
|---|---|---|---|---|
| 4,263,618 A * | 4/1981 | Wine | | 348/725 |
| 4,561,002 A * | 12/1985 | Chiu | | 341/26 |
| 5,146,357 A * | 9/1992 | Epstein | | 398/136 |
| 5,345,807 A * | 9/1994 | Butts et al. | | 73/1.15 |
| 5,430,443 A * | 7/1995 | Mitchell | | 341/22 |
| 5,508,700 A * | 4/1996 | Taylor et al. | | 341/33 |
| 5,572,205 A * | 11/1996 | Caldwell et al. | | 341/33 |
| 5,696,441 A * | 12/1997 | Mak et al. | | 324/115 |
| 5,856,666 A * | 1/1999 | Moulsley | | 250/208.1 |
| 5,867,111 A * | 2/1999 | Caldwell et al. | | 341/33 |
| 5,944,813 A * | 8/1999 | Trimberger | | 712/36 |
| 5,973,417 A * | 10/1999 | Goetz et al. | | 307/129 |
| 6,078,358 A * | 6/2000 | Bird | | 348/310 |
| 6,614,697 B2 * | 9/2003 | Hogan | | 365/189.02 |
| 7,123,170 B1 * | 10/2006 | Iacob | | 341/26 |
| 2002/0015024 A1 * | 2/2002 | Westerman et al. | | 345/173 |
| 2002/0130848 A1 * | 9/2002 | Sims | | 345/173 |
| 2002/0133794 A1 * | 9/2002 | Kanapathippillai et al. | | 716/4 |
| 2006/0250345 A1 * | 11/2006 | Shino et al. | | 345/100 |
| 2007/0074913 A1 * | 4/2007 | Geaghan et al. | | 178/18.06 |
| 2008/0111714 A1 * | 5/2008 | Kremin | | 341/33 |
| 2008/0157733 A1 * | 7/2008 | Williams | | 323/266 |
| 2010/0109866 A1 * | 5/2010 | Gavrila et al. | | 340/540 |
| 2011/0037735 A1 * | 2/2011 | Land et al. | | 345/178 |

* cited by examiner

*Primary Examiner* — Bipin Shalwala
*Assistant Examiner* — Keith Crawley
(74) *Attorney, Agent, or Firm* — Muncy, Geissler, Olds & Lowe, P.C.

(57) ABSTRACT

A capacitance touch sensor includes a square wave generator for generating a square wave clock, a sensor panel for receiving the square wave clock and then generating a panel signal, a peak detector for receiving the panel signal and then generating an analog peak signal, an analog-to-digital converter for receiving the analog peak signal and then generating a digital peak signal, and a control unit for receiving the digital peak signal and generating a detection signal according to a level of the digital peak signal to indicate whether the sensor panel is touched or not.

3 Claims, 3 Drawing Sheets

CAPACITANCE TOUCH SENSOR

BACKGROUND OF THE INVENTION

This application claims the benefit of the filing date of Taiwan Application Ser. No. 096112960, filed on Apr. 13, 2007, the content of which is incorporated herein by reference.

FIELD OF THE INVENTION

The invention relates to a capacitance touch sensor, and more particularly to a capacitance touch sensor capable of saving a resource of a central processing unit.

RELATED ART

FIG. 1 shows the architecture of a conventional capacitance touch sensor 10. Referring to FIG. 1, the capacitance touch sensor 10 includes a capacitor 11, a resistor 12, a panel 13 and an input/output port 14. When the panel 13 is touched by a finger, its stray capacitance Cx changes (increases). The capacitance touch sensor 10 detects a variation from the stray capacitance Cx of the panel (sensor) 13 with respect to the ground according to the charging/discharging method, and thus judges whether the panel 13 is touched or not. FIG. 2 is a schematic illustration showing a waveform for calculating a discharge time by way of counting. That is, when the panel 13 is touched by the finger, its stray capacitance Cx increases and the discharge time thereof is also lengthened. Therefore, it is possible to judge whether the panel 13 is touched or not according to the discharge time.

However, the variation from the stray capacitance Cx of the panel 13 is not significant, so the sample/count speed of the capacitance touch sensor has to be very high so that whether the panel 13 is touched or not can be judged. Therefore, the higher resource of a central processing unit is occupied. In addition, each input/output port 14 can only process one sensor, and the number of the input/output ports 14 has to be correspondingly increased when the number of the sensors is increased.

SUMMARY OF THE INVENTION

In view of the above-mentioned problems, it is therefore an object of the invention to provide a capacitance touch sensor, which occupies a lower resource of a central processing unit.

Another object of the invention is to provide a capacitance touch sensor, which has the matrix architecture and can detect a greater number of panels via a smaller number of input/output ports.

The invention achieves the above-identified objects by providing a capacitance touch sensor including a square wave generator, a sensor panel, a peak detector, an analog-to-digital converter and a control unit. The square wave generator generates a high-frequency square wave clock. The sensor panel receives the high-frequency square wave clock and then generates a panel signal. The peak detector receives the panel signal and then generates an analog peak signal. The analog-to-digital converter receives the analog peak signal and then generates a digital peak signal. The control unit receives the digital peak signal and generates a detection signal according to the digital peak signal to indicate whether the sensor panel is touched or not.

The invention also achieves the above-identified objects by providing a capacitance touch sensor including a square wave generator, N buffers, a plurality of sensor panels, M peak detectors, M analog-to-digital converters and a control unit. The square wave generator generates a high-frequency square wave clock. The N buffers are respectively controlled by N control signals. Only one of the N control signals is enabled at the same time, wherein N is an integer greater than 1. The sensor panels constitute architecture of a matrix having N columns and M rows. Input terminals of each of the columns of the sensor panels are respectively connected to an output terminal of one of the N buffers, and M is an integer greater than 1. The M peak detectors respectively receive output signals of the M rows of sensor panels and generate analog peak signals. The M analog-to-digital converters respectively receive the analog peak signals of the M peak detectors and generate digital peak signals. The control unit sequentially receives the digital peak signals of the M analog-to-digital converters and respectively generates a plurality of detection signals according to the digital peak signals to judge whether the plurality of sensor panels is touched or not. The control unit further generates the N control signals.

The variation of the stray capacitance Cx is converted into the variation of the DC voltage. Then, the control unit reads the variation of the DC voltage through the analog-to-digital converter in order to prevent the central processing unit of the control unit from being occupied when the variation of the stray capacitance is being read. Meanwhile, the switch signals and the input signals of the analog-to-digital converters may constitute the matrix architecture, so the states of the greater number of panels can be read through the smaller number of the input/output ports.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

The capacitance touch sensor of the invention will be described with reference to the accompanying drawings.

Figure 1:
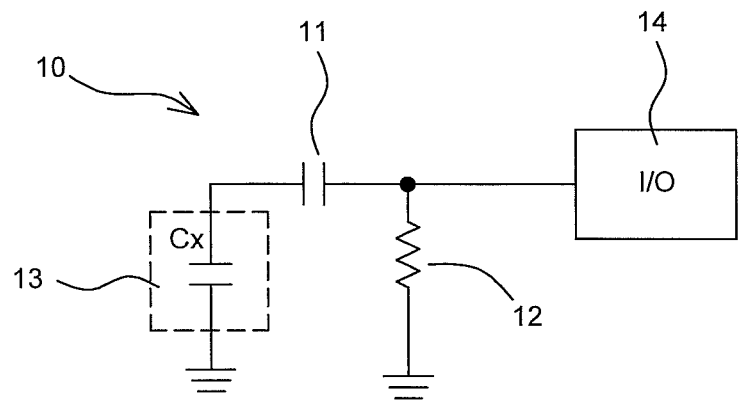
FIG. 1 shows the architecture of a conventional capacitance touch sensor.
Figure 2:
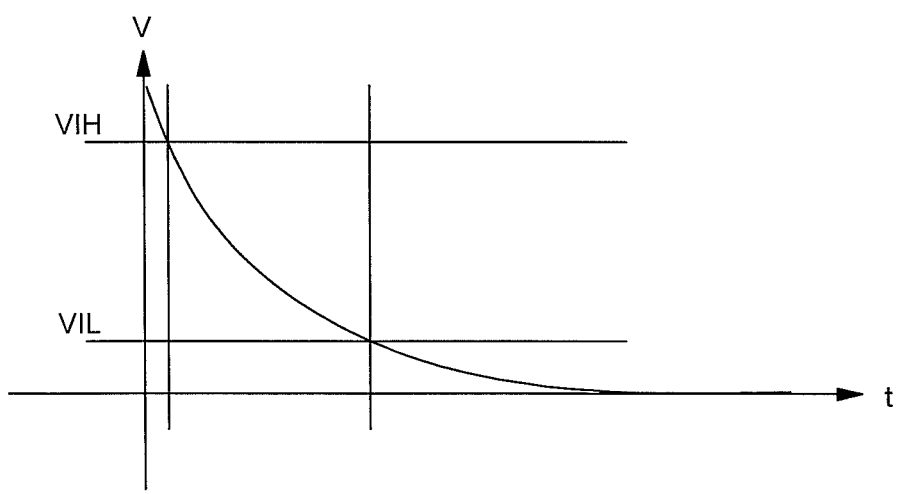
FIG. 2 is a schematic illustration showing a waveform for calculating a discharge time by way of counting.
Figure 3:
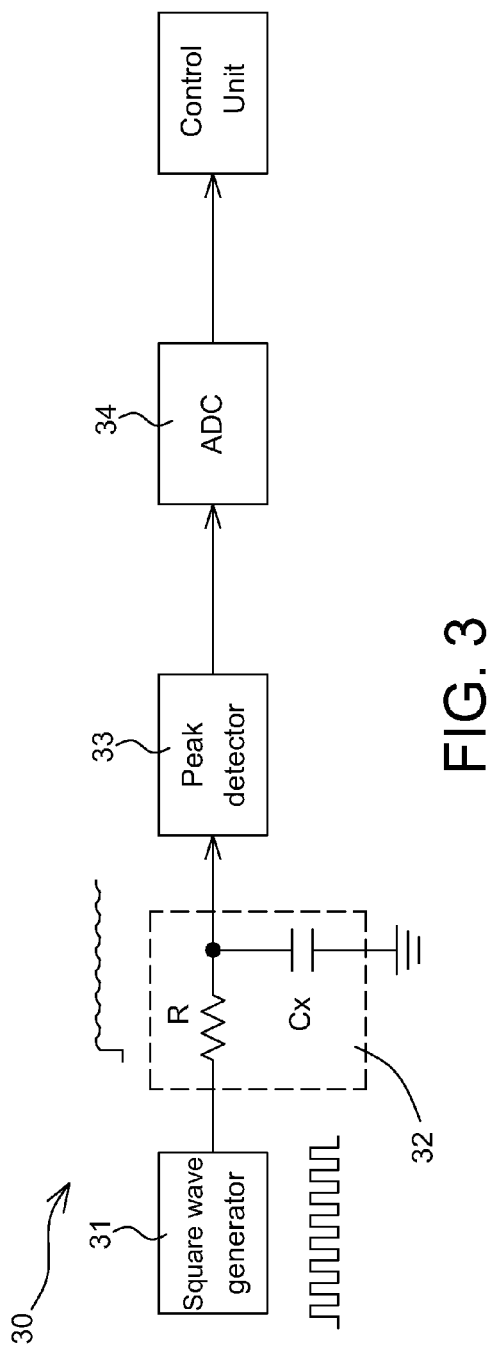
FIG. 3 shows the architecture of a capacitance touch sensor according to the invention.

FIG. 3 shows the architecture of a capacitance touch sensor 30 according to the invention. Referring to FIG. 3, the capacitance touch sensor 30 of the invention includes a square wave generator 31, a sensor panel 32, a peak detector 33 and an analog-to-digital converter 34. The square wave generator 31 generates a high-frequency square wave clock. The sensor panel 32 includes a resistor R and a varactor (parasitic capacitor) Cx of a panel. Thus, the sensor panel 32 may be regarded as a low-pass filter. The capacitance of the varactor Cx is changed according to whether a capacitance object approaches or not. Therefore, the sensor panel 32 receives the high-frequency square wave clock and then generates a panel signal. The peak of the panel signal changes when the capacitance of the varactor Cx changes. So, the peak detector 33 can detect the peak of the varactor Cx. Finally, a control unit (not shown) of the capacitance touch sensor can judge whether the panel is touched according to the variation of the peak. Because the peak changes slowly, the usage of the resource of a central processing unit (CPU) of the control unit can be effectively reduced. The variation of the varactor Cx is converted into the variation of the DC voltage (or current). Thereafter, the analog-to-digital converter (ADC) reads the variation of the DC voltage to prevent the control unit (not shown) from being occupied due to the variation of the read capacitance.

Figure 4:
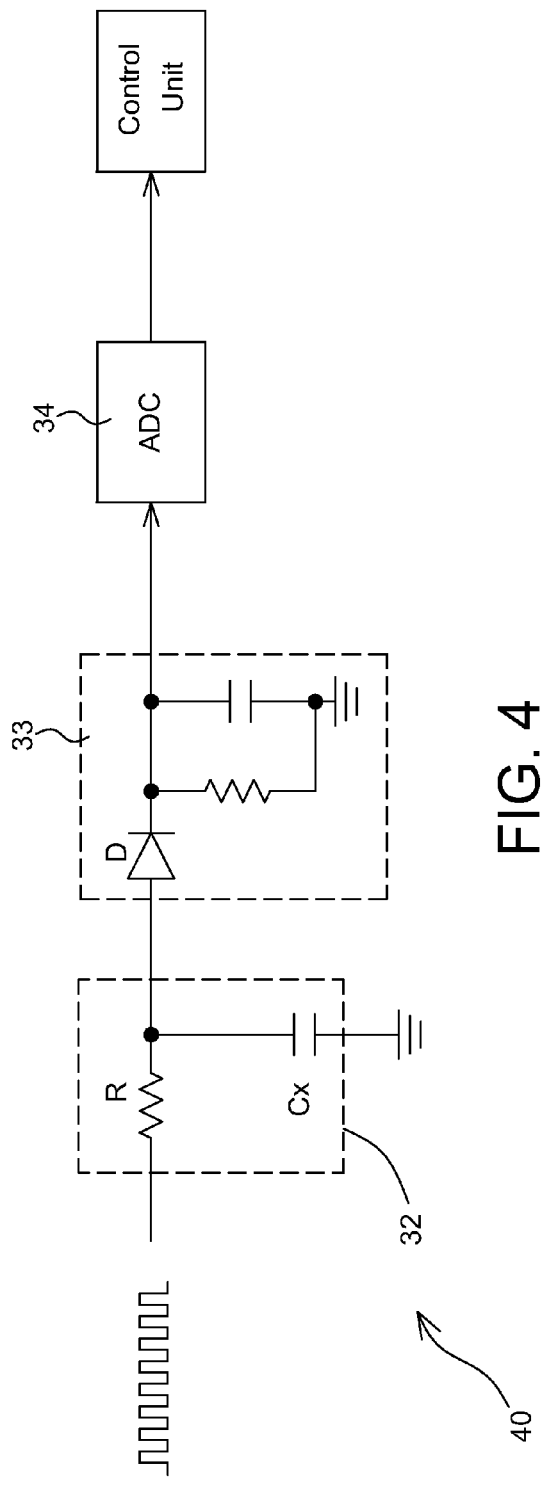
FIG. 4 shows a single capacitance touch sensor according to an embodiment of the invention.

FIG. 4 shows a single capacitance touch sensor 40 according to an embodiment of the invention. As shown in FIG. 4, the high-frequency square wave clock may be provided by a square wave generator. The sensor panel 32 receives the high-frequency square wave clock and then generates a panel signal. The sensor panel 32 is composed of the resistor R and the varactor Cx of the panel, and may be regarded as a low-pass filter. The peak detector 33 of this embodiment is composed of a resistor and a capacitor connected in parallel. Of course, the peak detector 33 may be connected to a diode D in series. The peak detector 33 holds the peak voltage of the panel signal of the sensor panel 32 and then generates an analog peak signal. Thus, the control unit (not shown) of the capacitance touch sensor 40 can utilize the analog-to-digital converter (ADC) to periodically read the analog peak signal generated by the peak detector 33, and to generate a digital peak signal. So, the control unit of the capacitance touch sensor 40 only has to determine whether the digital peak signal exceeds a threshold value and generate a detection signal to judge whether the panel is touched.

Figure 5:
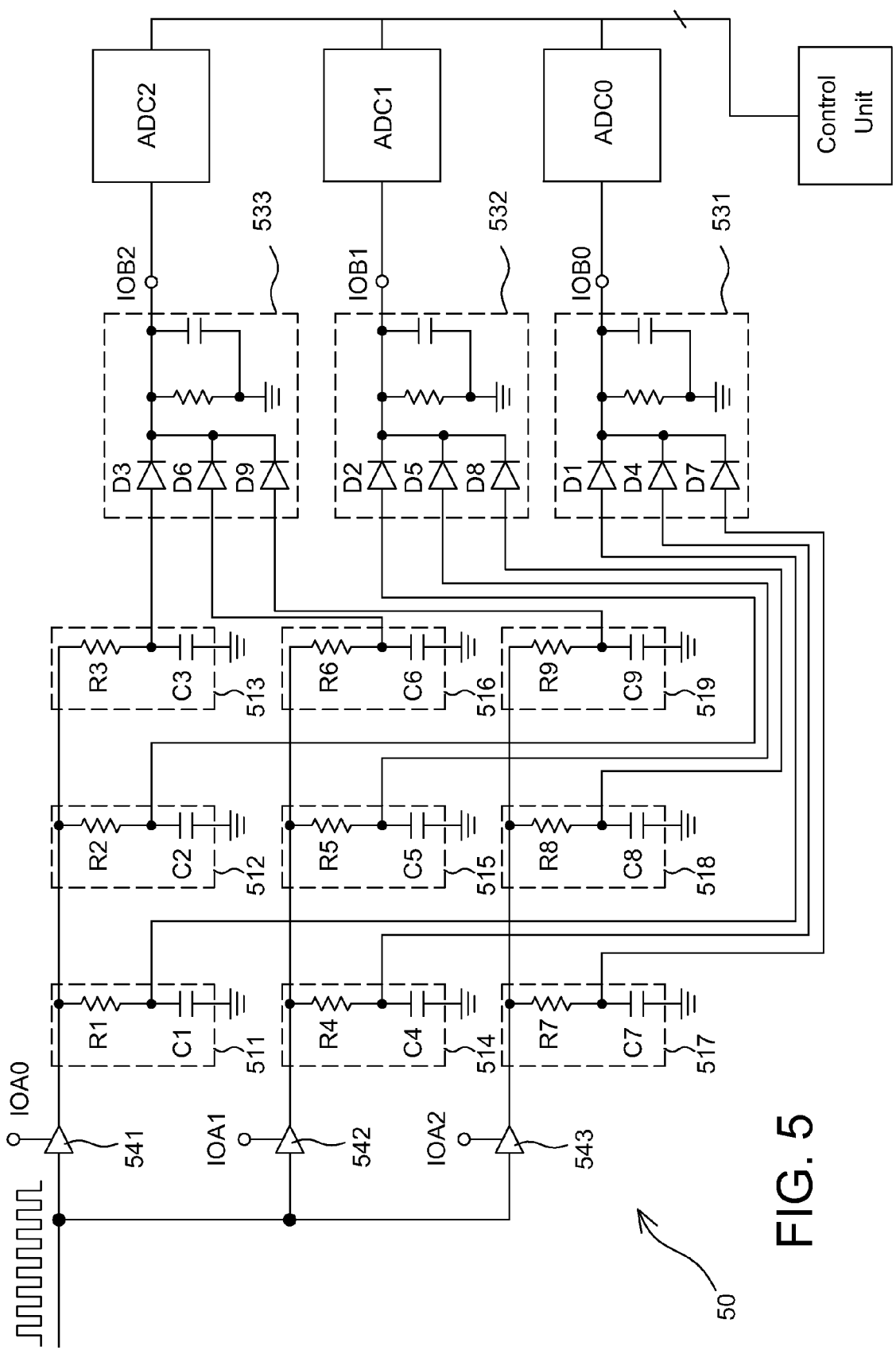
FIG. 5 shows a capacitance touch sensor having 9 panels implemented by the 3×3 matrix architecture according to another embodiment of the invention.

The capacitance touch sensor of the invention occupies the lower resource of the central processing unit of the control unit, so the sensor panels may be configured to have the matrix architecture to further decrease the usage of input/output ports. FIG. 5 shows a capacitance touch sensor 50 having panels implemented by the N×M matrix architecture according to another embodiment of the invention, wherein N and M are equal to 3 in this example. Referring to FIG. 5, the capacitance touch sensor 50 of the matrix architecture includes 3(N) buffers 541 to 543, 9(N×M) sensor panels 511 to 519, 3(M) peak detectors 531 to 533, 3(M) analog-to-digital converters ADC0 to ADC2 and a control unit. Input/output ports IOA0 to IOA2 are controlled by the control unit and thus output three control signals for respectively controlling the buffers 541 to 543 to turn on or off. The analog peak signals are inputted to the input/output ports IOB0 to IOB2. Each of the sensor panels 511 to 519 includes one resistor R and one stray capacitor Cx generated by one panel. Each of the peak detectors 531 to 533 is composed of a resistor and a capacitor connected in parallel. Of course, the peak detectors 531 to 533 may respectively use diodes D1 to D9, wherein each of the peak detectors 531 to 533 uses three diodes, in order to prevent the signals between the sensor panels from influencing one another, wherein N and M are integers greater than 1.

The capacitance touch sensor 50 with the matrix architecture is implemented according to the time-sharing and multiplex principle. That is, the control unit only enables one column of the sensor panels to receive the high-frequency square wave clock at each time instant. Therefore, each peak detector only receives one output signal from one sensor panel and thus judges whether the column of the sensor panels are touched. The detailed operation flows of the capacitance touch sensor 50 with the matrix architecture will be described in the following.

First, the control unit enables the signal of the input/output port IOA0 so that the high-frequency square wave clock is inputted to the sensor panels 511 to 513. Because the signals inputted to the input/output ports IOA1 and IOA2 are disabled, no high-frequency square wave clock is inputted to the sensor panels 514 to 519, and the peak detectors 531 to 533 only receive the output signals from the sensor panels 511 to 513. Meanwhile, the control unit (not shown) of the capacitance touch sensor 50 sequentially samples the digital peak signals of the analog-to-digital converters ADC0 to ADC2 to judge whether the sensor panels 511 to 513 are touched or not.

Next, the control unit enables the signal of the input/output port IOA1 so that the high-frequency square wave clock is inputted to the sensor panels 514 to 516. Because the signals inputted to the input/output ports IOA0 and IOA2 are disabled, no high-frequency square wave clock is inputted to the sensor panels 511 to 513 and 517 to 519, and the peak detectors 531 to 533 only receive the output signals from the sensor panels 514 to 516. Meanwhile, the control unit of the capacitance touch sensor 50 sequentially samples the digital peak signals of the analog-to-digital converters ADC0 to ADC2 to judge whether the sensor panels 514 to 516 are touched or not.

Finally, the control unit enables the signal of the input/output port IOA2 so that the high-frequency square wave clock is inputted to the sensor panels 517 to 519. Because the signals inputted to the input/output ports IOA0 and IOA1 are disabled, no high-frequency square wave clock is inputted to the sensor panels 511 to 516 and the peak detectors 531 to 533 only receive the output signals from the sensor panels 517 to 519. Meanwhile, the control unit (not shown) of the capacitance touch sensor 50 sequentially samples the digital peak signals of the analog-to-digital converters ADC0 to ADC2 to judge whether the sensor panels 517 to 519 are touched or not.

The capacitance touch sensor of the invention does not need the central processing unit to calculate the discharge time but only has to read the peak of the varactor Cx periodically in order to judge whether the sensor is touched or not. Therefore, the capacitance touch sensor of the invention can save the resource of the central processing unit. Furthermore, the sensor panels may be configured to have the matrix architecture according to the capacitance touch sensor of the invention, so the usage of the input/output ports may further be reduced.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A capacitance touch sensor comprising:
   a square wave generator for generating a square wave clock;

N buffers, respectively controlled by N control signals, wherein only one of the N control signals is enabled at the same time, and N is an integer greater than 1;

a plurality of sensor panels, which constitutes architecture of a matrix having N columns and M rows, wherein each of sensor panels comprises a first metal and a second metal, wherein the first metal is coupled to the square wave generator for receiving the square wave clock and the second metal is coupled to a common voltage, wherein input terminals of each of the columns of the sensor panels are respectively connected to an output terminal of one of the N buffers, and M is an integer greater than 1, wherein the sensor panels exclude any active component;

M peak detectors for respectively receiving output signals of the M rows of sensor panels and generating analog peak signals, wherein the $i^{th}$ peak detector corresponds to sensor panels at the $i^{th}$ row, and the $i^{th}$ peak detector comprises:

N diodes, each of the N diodes having a P pole and a N pole, wherein the P pole of the $j^{th}$ diode of the $i^{th}$ peak detector is directly connected to the first metal of the corresponding sensor panel at the $i^{th}$ row and the $j^{th}$ column, and the N poles are connected together, wherein i and j are natural numbers, i is smaller than or equal to M, and j is smaller than or equal to N;

a resistor having a first terminal, which is directly connected to the N poles of the N diodes and generates the analog peak signal, and a second terminal grounded; and a capacitor connected to the resistor in parallel;

M analog-to-digital converters for respectively receiving the analog peak signals of the M peak detectors and generating digital peak signals; and a control unit for sequentially receiving the digital peak signals of the M analog-to-digital converters and respectively generating a plurality of detection signals according to the digital peak signals to judge whether the plurality of sensor panels is touched or not, wherein the control unit further generates the N control signals; and wherein there is no amplifier between the sensor panels and the peak detectors.

2. The capacitance touch sensor according to claim 1, wherein each of the sensor panels comprises:

a resistor having a first terminal for receiving the square wave clock; and a panel capacitor having a first terminal connected to a second terminal of the resistor, and a second terminal grounded.

3. The capacitance touch sensor according to claim 1, wherein the control unit sequentially enables the N control signals so that the square wave clock is sequentially inputted to the corresponding M sensor panels, while the control unit receives the digital peak signals of the M analog-to-digital converters and generates the plurality of detection signals according to the digital peak signals to judge whether the sensor panels are touched or not.

* * * * *